United States Patent [19]

Gati et al.

[11] Patent Number: 4,601,939
[45] Date of Patent: Jul. 22, 1986

[54] COMPOSITE INSULATOR STRUCTURE

[75] Inventors: George S. Gati, Wappingers Falls; Albert P. Lee; Geraldine C. Schwartz, both of Poughkeepsie; Charles L. Standley, Wappingers Falls, all of N.Y.

[73] Assignee: International Business Machines Corporation, Armonk, N.Y.

[21] Appl. No.: 534,036

[22] Filed: Sep. 20, 1983

[51] Int. Cl.⁴ .............................................. B32B 3/02
[52] U.S. Cl. ...................... 428/161; 357/54; 357/71; 428/164; 428/213; 428/215; 428/448; 428/472; 428/698; 428/699; 428/702
[58] Field of Search ............ 357/54, 71; 428/161, 428/162, 164, 448, 472, 698, 699, 213, 215, 702; 427/93, 94, 89, 90; 430/314

[56] References Cited

U.S. PATENT DOCUMENTS

| | | | |
|---|---|---|---|
| 3,832,247 | 8/1974 | Saddler et al. | 428/161 |
| 4,091,406 | 5/1978 | Lewis | 357/54 |
| 4,091,407 | 5/1978 | Williams et al. | 357/54 |
| 4,097,889 | 6/1978 | Kern et al. | 357/54 |
| 4,113,515 | 9/1978 | Kooi et al. | 427/94 |
| 4,182,781 | 1/1980 | Hooper et al. | 427/90 |
| 4,222,792 | 9/1980 | Lever et al. | 427/95 |
| 4,377,438 | 3/1983 | Moriya et al. | 156/643 |
| 4,420,497 | 12/1983 | Tickle | 427/8 |
| 4,451,326 | 5/1984 | Guozdz | 156/643 |
| 4,452,826 | 6/1984 | Shields et al. | 427/38 |
| 4,454,166 | 6/1984 | Abe et al. | 427/85 |

OTHER PUBLICATIONS

Doo, V. Y., IBM Tech. Discl. Bull., vol. 13, No. 2, Jul. 1970, pp. 506–507.
Dougherty, W. E., IBM Tech. Discl. Bull., vol. 23, No. 1, Jun. 1980, pp. 161–162.
Bartush et al, IBM TDB, vol. 23(11), p. 4907 (1981).
Bartush et al, IBM TDB, vol. 24(12), p. 6451 (1982).
Dalal et al, IBM TDB, vol. 26(3B), p. 1513 (1983).
Levin et al; "The Step Coverage of Undoped and Phosphorus Doped SiO₂ Glass Films", J. Vac. Sci. Technol., B1(1), Jan.–Mar. 1983, p. 54.

Primary Examiner—Marion C. McCamish
Assistant Examiner—William M. Atkinson
Attorney, Agent, or Firm—Robert J. Haase

[57] ABSTRACT

A composite insulator structure separating adjacent layers of patterned metal on an LSI chip is disclosed. The bottom layer of sputtered oxide is thicker than the top layer and is preferably planarized. The top layer is conformal plasma nitride so as to uncover unwanted projections on the underlying metal and prevent interlevel shorting between the patterned layers.

6 Claims, 2 Drawing Figures

COMPOSITE INSULATOR STRUCTURE

DESCRIPTION

1. Cross-Reference to Related Application

A related patent application is Ser. No. 534,046 filed Sept. 20, 1983 in the names of Robert R. Joseph et al., for "Composite Insulator Structure" and assigned to the present assignee.

2. Field of the Invention

This invention relates to insulator structure for semiconductor devices. In particular, it relates to a multilayer insulation structure interposed between two layers of metallization.

3. Prior Art

In the manufacture of semiconductor devices it is conventional to utilize a planar layer of insulation between two layers of metallization. The metallization lines are disposed on different planes to form a desired interconnection pattern. In such devices, interlevel shorts between successive levels of chip metallization may occur as a result of a contaminant such as particles or excess metal projections. If this unwanted material is present and rises over the top surface of the first level of metallization, a planar level of insulator will be unable to cover this material adequately. Subsequently, when the next level of metallization is deposited the inadequately covered projection becomes a candidate for an eventual short between the two layers of metal. Various techniques have been proposed in the prior art to eliminate such interlevel shorts.

U.S. Pat. No. 4,001,870 defines an insulator structure comprising an organic compound used with an organic coupling agent. This technique is directed at eliminating interlevel shorts as a consequence of pinhole defects. Thus, an insulating film comprising a silicon dioxide layer having a thin layer disposed thereon of an organic compound such as heat resisting polymer resin is employed. U.S. Pat. No. 4,045,594 defines the technique of gap filling utilizing a planar surface. A Chemically Vapor Deposited (CVD) insulator is used to form a first planar layer of insulation on top of a conductive pattern. Gaps which are the result of the removal of this insulator below the photoresist during the etching process are then filled, utilizing a second insulating film which is deposited by CVD such that holes are covered and the resulting dielectric is a planar layer. The same technique is employed in U.S. Pat. No. 4,185,294. Dual dielectric layers are formed between two layers of metallization. In order to eliminate pinhole formations the top layer is thicker than the bottom layer. The two layers are deposited by CVD such that a planar surface is achieved by gap filling.

U.S. Pat. No. 4,242,698 deposits a plasma nitride under a first level of metallization to function as an etch stop. An apertured insulation layer of plasma oxide is formed between first and second levels of metallization, the apertures serving as vias for level to level interconnection.

Other techniques of double dielectric isolation for a multi-level metallization are shown in IBM Technical Disclosure Bulletin Vol. 23, No. 5, page 1832 (October, 1980). In IBM Technical Disclosure Bulletin Vol. 23, No. 7B, page 3210-3211, plasma enhanced CVD dielectric layers are disposed over an FET structure to replace the polyimide insulator of that transistor utilizing a suitable inorganic material which can be etched for vias without damaging the underlying substrate. Another dual dielectric insulator not covering two layers of metallization is shown in IBM TDB Vol. 23, No. 9, page 4140 (February, 1981). The use of a plasma deposited nitride layer and a quartz layer in a stud interconnection process is disclosed in IBM TDB Vol. 23, No. 11 page 4907 (April, 1981).

While the prior art discloses a variety of techniques for reducing, for example, pinhole defect shorting or to reduce and simplify processing steps in the formation of insulation layers between levels of metallization, none are directed specifically to the elimination of interlevel shorts caused by contaminants or excess metallization. Additionally, in many of the prior art techniques, multiple etching steps are necessary to effectively remove the insulation layers for via etching.

SUMMARY OF INVENTION

Given the deficiencies in the prior art, it is an object of the present invention to define a technique of eliminating interlevel shorts caused by contaminants rising over or causing a bulge in the top surface of a first layer of metal.

Another object of this invention is to define a technique of reducing insulator failures between two levels of metallization.

A further object of this invention is to define a composite insulator that covers contaminants and projections in a metallization layer without causing excessive topology.

These and other objects of this invention are achieved in a composite insulator structure separating adjacent layers of patterned metal on a LSI chip. The bottom layer (sputtered oxide) is thicker than the top layer which is either a plasma nitride, oxynitride or oxide. The top thinner layer is conformal and able to cover projections on the underlying metal. The two layers may be etched for vias in a single etching step. This invention will be defined in greater detail by referring to the accompanying drawing and the description of the preferred embodiment that follows.

DESCRIPTION OF THE PREFERRED EMBODIMENT

Conventionally, an insulator, comprising $SiO_2$, is applied utilizing a sputter coating and the like to a thickness of approximately 25,000 Å. If projections exist on the metal layer, the sputtered $SiO_2$ will not cover reliably that unwanted material. Increasing the thickness of the single dielectric layer tends to enhance the reliability of coverage of projections but exascerbates the resist problems, metal thinning problems and topography problems associated with placing connection vias through excessively thick dielectric layers. Alternatively, the use of a single conformal coating of an insulator so as to avoid the need for excessive dielectric layer thickness, merely propagates the existing underlying topography problems especially where multi-level metallization is required.

The present invention departs from the above prior art teachings by the provision of a conformal layer of dielectric material on top of a preferably planarized layer of dielectric material so as to meet the dual requirements of covering metal projections while at the same time substantially planarizing the resultant structure.

Figure 1:
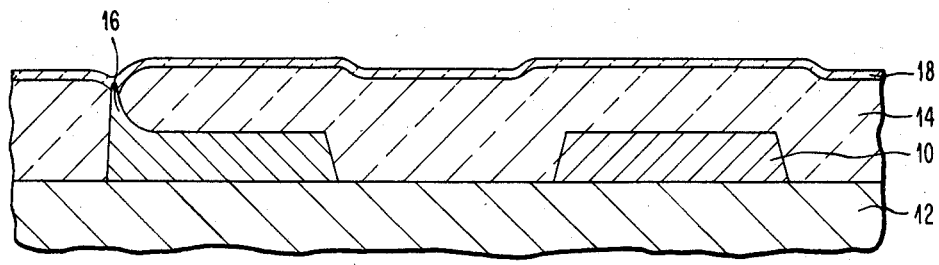
FIG. 1 is a schematic elevation view showing the dual layer insulator structure of the present invention.

Referring now to FIG. 1, the preferred embodiment of this invention is shown. In the formation of an LSI chip, the first level of patterned metallization 10 is applied on the chip surface 12. A thick layer 14 of sputtered $SiO_2$ is deposited using sputtering conditions which result in a substantially planarized layer. Such a process is described, for example, in U.S. Pat. No. 4,131,533 for RF Sputtering Apparatus Having Floating Anode Shield, issued Dec. 26, 1978 to J. A. Bialko et al, and assigned to the present assignee. Projection 16 is not adequately covered by planarized layer 14 and would become a likely path for an eventual short between the first layer 10 and a subsequent overlying level of metallization. To eliminate this problem, the present invention replaces the top 2000 Å to 3000 Å of sputter coated $SiO_2$ 14 with a conformal coating 18 of plasma $SiO_x$ or $Si_xN_y$ or silicon oxynitride. Importantly, the plasma deposited insulator conformally covers the projection. This layer 18, therefore, as shown in FIG. 1, conforms to the projection 16 such that the weak spot which would otherwise be created is now conformally covered. Thus, a projection which would cause either an immediate short or a failure at a later point in time is eliminated.

Figure 2:
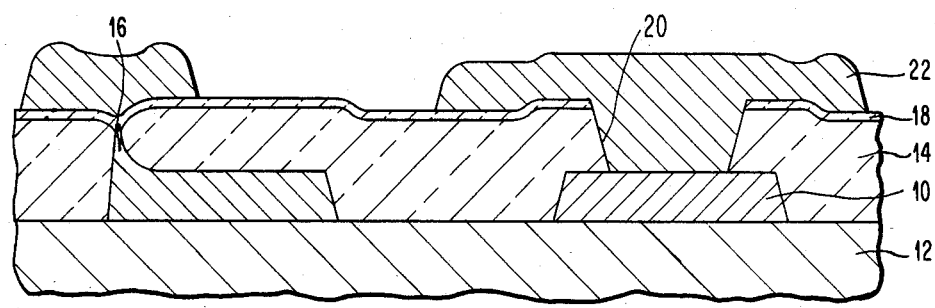
FIG. 2 is a schematic elevation view showing the composite insulator of this invention following etching for vias and deposition and patterning of a second level of metallization.

Referring to FIG. 2, after the composite insulator is deposited, via holes (20) are etched in it by any appropriate technique using conventional photolithography to produce the via hole pattern in the masking resist layer. After resist strip, a second metallization layer (22) is deposited and patterned. That portion of the metallization layer covering the via holes forms the interconnection between metal levels. The composite insulator prevents unwanted interconnections (i.e., shorts).

In order to demonstrate the superiority of this technique over the prior art, interlevel short testing was done on a variety of chips which were split between two production techniques. The plasma deposition of layer 18 was done utilizing an Applied Materials Corporation plasma tool operating under the following parameters:

Temperature: 300° C.
Pressure: 0.2 torr
Flow $SiH_4$: 66 SCCM
Flow $N_2O$: 1000 SCCM
RF Power: 200 watts In the control group utilizing standard techniques reliability failures were 0.8 percent. Utilizing the technology of the present invention failures were 0.34 percent. The control failures at 12 volts are deemed to be indicated as potential reliability failures with a target at 0.6 percent. Initial 1 volt short yield in this test was 3.6 percent higher for chips utilizing this technique.

While plasma deposition as set forth above provides one technique, other plasma deposit insulators utilizing other techniques can be used to obtain similar results even if different thicknesses are employed. The advantage of the present invention is that by using a plasma deposited insulator as a thin top layer very conformal coverage over projections is attained. The thin layer of conformal insulator therefore provides an adequate insulation without causing known problems as a result of excessive topology.

An additional advantage of this invention is that it can be etched for vias in a single step. Alternatively, depending on process techniques, multiple etching steps through the composite insulator may be utilized. That is, the sputter deposited $SiO_2$ layer can be applied in a conventional manner and then etching for vias as desired can be accomplished. The second deposition by plasma deposition of silicon oxide, nitride, oxynitride or other insulating material can then take place followed by utilizing a second etch technique to remove the plasma deposited material from the via holes. Etching can be dry etching, plasma or RIE. Thus, if desired, multiple etching steps may also be employed. In either case, the defect is affirmatively covered by a conformal insulating layer which eliminates projection related interlevel shorts.

It will be understood that the above description of the present invention is susceptible to various modifications, changes and adaptions, and the same are intended to be comprehended within the meaning of the appended claims.

We claim:

1. In a semiconductor device having at least two levels of metallization, wherein the top surface of the one of said levels of metallization which is closer to said device is characterized by a bulge caused by a contaminant or unwanted projection, a composite insulator deposited between said levels of metallization for reducing insulator failures between said levels of metallization, said composite insulator comprising:
   a first layer of dielectric material on said top surface of one of said levels of metallization which is closer to said device,
   the upper surface of said first layer being planar, and
   a second substantially conformal layer of dielectric material on said first layer,
   said second layer comprising plasma deposited $SiO_x$, $Si_xN_y$ or silicon oxynitride,
   said first layer being thicker than said second layer,
   said second layer being in contact with another of said levels of metallization.

2. The insulator of claim 1 wherein said first layer is sputtered $SiO_2$ and said second layer is plasma deposited silicon oxynitride.

3. The insulator of claim 1 wherein said first layer is sputtered $SiO_2$ and said second layer is plasma deposited $SiO_x$.

4. The insulator of claim 1 wherein said first layer is sputtered $SiO_2$ and said second layer is plasma deposited $Si_xN_y$.

5. The insulator of claim 4 wherein said first layer is approximately one order of magnitude thicker than said second layer.

6. The insulator of claim 5 wherein said second layer is in the range or approximately 2000 Å to 3000 Å thick.

* * * * *